(12) United States Patent
Rashid et al.

(10) Patent No.: US 8,208,658 B2
(45) Date of Patent: Jun. 26, 2012

(54) AMPLIFIER APPARATUS AND METHOD

(75) Inventors: Tahir Rashid, Berkshire (GB); Mark Childs, Wiltshire (GB)

(73) Assignee: Wolfson Microelectronics plc, Edinburgh (GB)

( * ) Notice: Subject to any disclaimer, the term of this patent is extended or adjusted under 35 U.S.C. 154(b) by 1300 days.

(21) Appl. No.: 11/892,641

(22) Filed: Aug. 24, 2007

(65) Prior Publication Data
US 2008/0069376 A1  Mar. 20, 2008

(30) Foreign Application Priority Data
Aug. 31, 2006  (GB) .................................. 0617196.1

(51) Int. Cl.
*H04B 15/00* (2006.01)

(52) U.S. Cl. ...................... 381/94.5; 381/94.6; 381/94.8

(58) Field of Classification Search .................. 341/144, 341/118, 143; 381/28, 94.1, 94.4, 94.5, 94.8, 381/111, 120, 121; 327/309, 321, 322, 538
See application file for complete search history.

(56) References Cited

U.S. PATENT DOCUMENTS

| | | | | |
|---|---|---|---|---|
| 5,642,076 A | * | 6/1997 | Naokawa et al. | 330/149 |
| 6,405,093 B1 | * | 6/2002 | Malcolm et al. | 700/94 |
| 6,522,278 B1 | | 2/2003 | Rhode et al. | |
| 6,775,387 B1 | | 8/2004 | Mavencamp et al. | |
| 7,254,244 B2 | * | 8/2007 | Henson et al. | 381/120 |
| 7,991,169 B2 | * | 8/2011 | McHugh et al. | 381/94.5 |
| 2007/0030038 A1 | * | 2/2007 | McHugh et al. | 327/100 |

FOREIGN PATENT DOCUMENTS

| | | |
|---|---|---|
| JP | 55091211 A | 7/1980 |
| JP | 59156007 A | 9/1984 |

* cited by examiner

*Primary Examiner* — Fan Tsang
*Assistant Examiner* — Eugene Zhao
(74) *Attorney, Agent, or Firm* — Dickstein Shapiro LLP

(57) ABSTRACT

An amplifier power-down apparatus for suppressing transient signals in a circuit, for example an audio circuit, comprising a reference voltage generator circuit for generating a reference voltage. The reference voltage generator circuit comprises a capacitor for maintaining the reference voltage at a desired level. The amplifier power-down apparatus comprises a discharge control circuit for controlling the operation of the reference voltage generator circuit during power-down. The discharge control circuit comprises an amplifier with a positive feedback path for controlling a current flow from the capacitor during power-down.

37 Claims, 9 Drawing Sheets

AMPLIFIER APPARATUS AND METHOD

TECHNICAL FIELD

The invention relates to an amplifier apparatus and method for reducing unwanted transient signals, and in particular to an amplifier power-down apparatus and method for reducing unwanted audible signals generated by transient, signals in an audio amplifier circuit.

BACKGROUND

"Click" and "pop" are terms used to describe unwanted audio-band transient signals that are heard in a headphone or a speaker when an audio amplifier is powered down.

In portable audio applications power consumption is a key issue, which means that circuit components, such as audio amplifiers, are often disabled or powered down when not required. This can lead to unwanted audio-band transient signals being produced each time an audio amplifier is powered down or placed in a sleep or hibernation mode. Similar problems can also arise in other non-portable applications.

Click and pop problems are particularly problematic in single supply amplifiers that have to charge to a certain defined voltage during power-up, which then has to be discharged during power-down.

FIG. 1 shows a known audio amplifier circuit 1 for driving a load 2, for example a headphone or a speaker, coupled to an output terminal 3. An output amplifier 5 receives an audio signal at a first input terminal 7 from an audio source, such as a mixer 9. It will be appreciated that the mixer 9 receives an audio signal from a DAC (not shown) or other signal source. The amplifier 5 also receives a reference voltage $V_{MID}$ at a second input terminal 11. In order for the output signal of the amplifier to achieve maximum swing, either side of its quiescent voltage, this quiescent voltage is set midway between the supply voltages VDD and ground (GND). The quiescent voltage is set by an applied reference voltage $V_{MID}$ equal to VDD/2.

The reference voltage $V_{MID}$ is produced by a reference voltage generator circuit 13. As will be described in greater detail below, a transient signal may be produced when the output amplifier 5 is powered down, thereby causing an unwanted "pop" being transmitted to the headphone or speaker.

It is noted that control logic 10 is provided for controlling the operation of the amplifier circuit 1 during various modes of operation. For example, the control logic 10 provides a control signal $S_1$ for controlling the reference generator circuit 13, a control signal $S_2$ for controlling the output amplifier 5 (for example when performing a mute operation), and a control signal $S_3$ for controlling a buffer circuit 14. The buffer circuit 14 buffers the reference voltage $V_{MID}$ received from the reference voltage generator circuit 13. It is noted that the buffer circuit is not essential to the operation of the amplifier circuit.

FIG. 2 illustrates an example of a power-down sequence for an audio amplifier according to the prior art. The first step, step 201, involves muting the output amplifier 5 using the control signal $S_2$ of the control logic 10. In the mute state the output is unaffected by the input signal, for example by interrupting the signal path using a switch. Next, circuit components upstream of the output amplifier 5 are disabled, for example the mixer 9, DAC (not shown), etc., step 203. After the upstream circuitry has been disabled, the reference voltage generator circuit 13 that produces the reference voltage $V_{MID}$ is then disabled, step 205. This is performed, for example, by opening the switch 131 of FIG. 1 using control signal $S_1$ from the control logic 10.

There is a delay while the reference voltage $V_{MID}$ falls to 0 v, step 207. This delay can take approximately 1 second depending on the total capacitive load. Once the reference voltage $V_{MID}$ has fallen to 0 v, the output amplifier 5 is then disabled or powered down, step 209.

When performing a power-down sequence such as that described above, a "pop" can be heard when the reference voltage $V_{MID}$ begins to discharge to ground, as will be described in further detail below.

FIG. 3 shows the reference voltage generator circuit 13 for producing the reference voltage $V_{MID}$. The reference voltage $V_{MID}$ can be produced using a potential divider circuit, for example, that comprises resistive elements 137 and 139. If the voltage level of the reference voltage is chosen to be VDD/2, then the resistive elements 137 and 139 will have equal values. It will be appreciated that the resistive elements 137 and 139 would have different values if a different reference voltage was required. A decoupling capacitor 135 is connected across resistive element 139. It is noted that, in the case of an integrated circuit arrangement, the decoupling capacitor 135 may be provided off-chip, if desired, and is used to decouple the $V_{MID}$ node 133. A switch 131 is provided for enabling and disabling the reference voltage generator circuit 13, under control of the control signal $S_1$.

FIG. 4 shows the reference voltage $V_{MID}$ at node 133 during power-down of the amplifier circuit 1. When the reference voltage generator circuit 13 is switched off at $t_{OFF}$, for example by opening switch 131, the capacitor 135 is discharged through resistor 139. This results in a slope discontinuity or rapid deviation in the reference voltage $V_{MID}$ at $t_{OFF}$. As the decoupling capacitor 135 continues to discharge, the fall in voltage level of the reference voltage $V_{MID}$ becomes more gradual until the decoupling capacitor 135 is fully discharged. This slope discontinuity of the reference voltage $V_{MID}$ at $t_{OFF}$ produces audible signal components that propagate through capacitor 15 and onto the load, and thus also causes an audible pop.

One method of avoiding these slope discontinuities would be to increase the value of resistor 139. However, since the total time taken to discharge the capacitor 135 depends on the value of resistor 139, an increased value of resistor 139 would lead to an unacceptably long discharge time (several seconds), whereas the discharge time is desired to be a few hundred milliseconds.

It is therefore an aim of the present invention to provide an amplifier power-down apparatus and method for reducing unwanted signals in an audio circuit.

SUMMARY

According to a first aspect of the invention, there is provided an amplifier power-down apparatus for reducing transient signals in an audio circuit comprising a reference voltage generator circuit for generating a reference voltage, the reference voltage generator circuit comprising a capacitor for maintaining the reference voltage at a desired voltage level. The apparatus comprises a discharge control circuit for controlling the operation of the reference voltage generator circuit during power-down. The discharge control circuit comprises an amplifier with a positive feedback path for controlling a current flow from the capacitor.

The amplifier power-down apparatus has the advantage of reducing audible transient signals during power-down of an audio amplifier.

According to another aspect of the present invention, there is provided a method for reducing transient signals in an audio circuit comprising a reference voltage generator circuit for generating a reference voltage, the reference voltage generator circuit comprising a capacitor for maintaining the reference voltage at a desired voltage level. The method comprises the steps of providing a discharge control circuit for controlling the operation of the reference voltage generator circuit during power-down, and controlling a current flow from the capacitor of the reference voltage generator circuit using an amplifier with a positive feedback path.

According to further aspects of the invention, there are provided various systems employing the amplifier power-down apparatus as defined in the appended claims. These include, but are not limited to, audio apparatus, portable audio apparatus, headphone amplifiers, headphones, communications apparatus (eg mobile phones), and in-car audio apparatus.

BRIEF DESCRIPTION OF THE DRAWINGS

For a better understanding of the present invention, and to show more clearly how it may be carried into effect, reference will now be made, by way of example only, to the following drawings in which.

DETAILED DESCRIPTION

Figure 1:
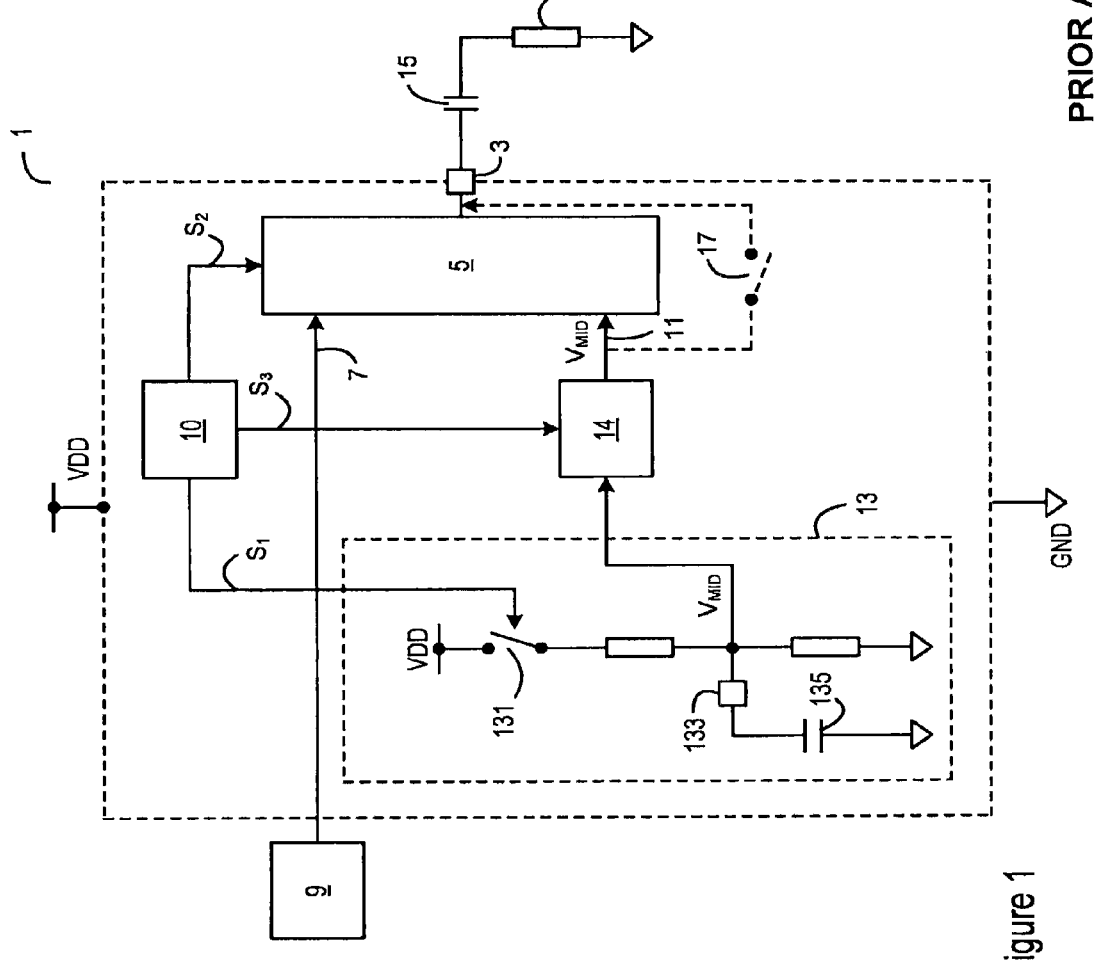
FIG. 1 shows an audio circuit according to the prior art.
Figure 2:
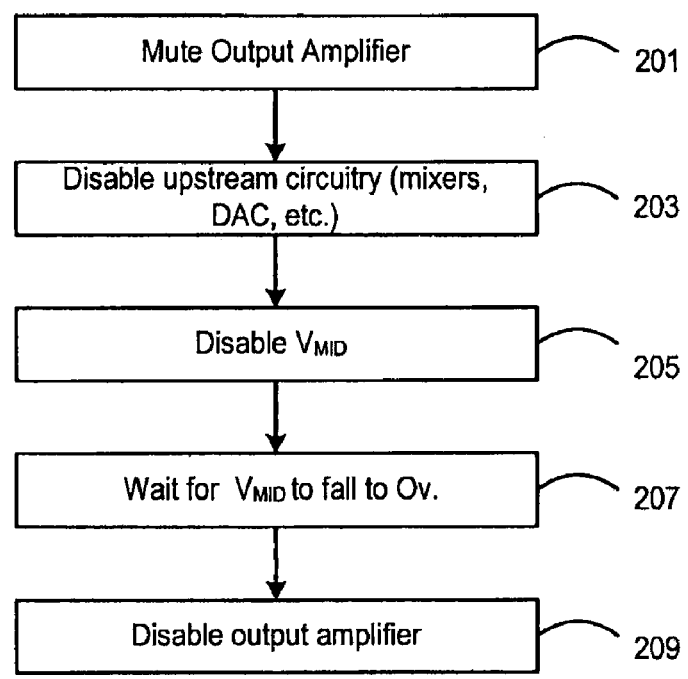
FIG. 2 describes a typical power-down sequence for the circuit shown in FIG. 1.
Figure 3:
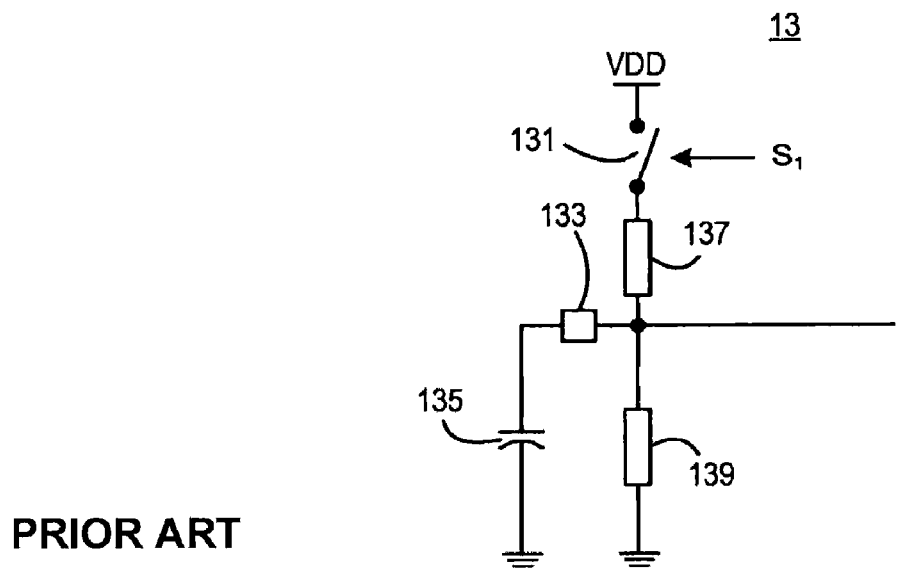
FIG. 3 shows a reference voltage generator circuit according to the prior art.
Figure 4:
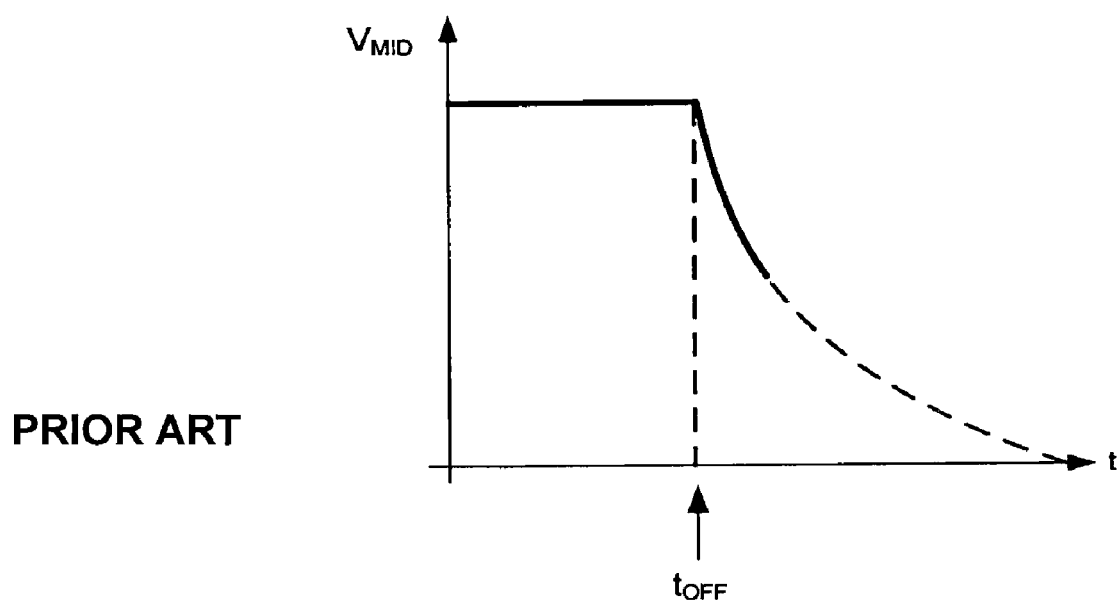
FIG. 4 is a graph showing how the reference voltage discharges during power-down in a prior art circuit.
Figure 5:
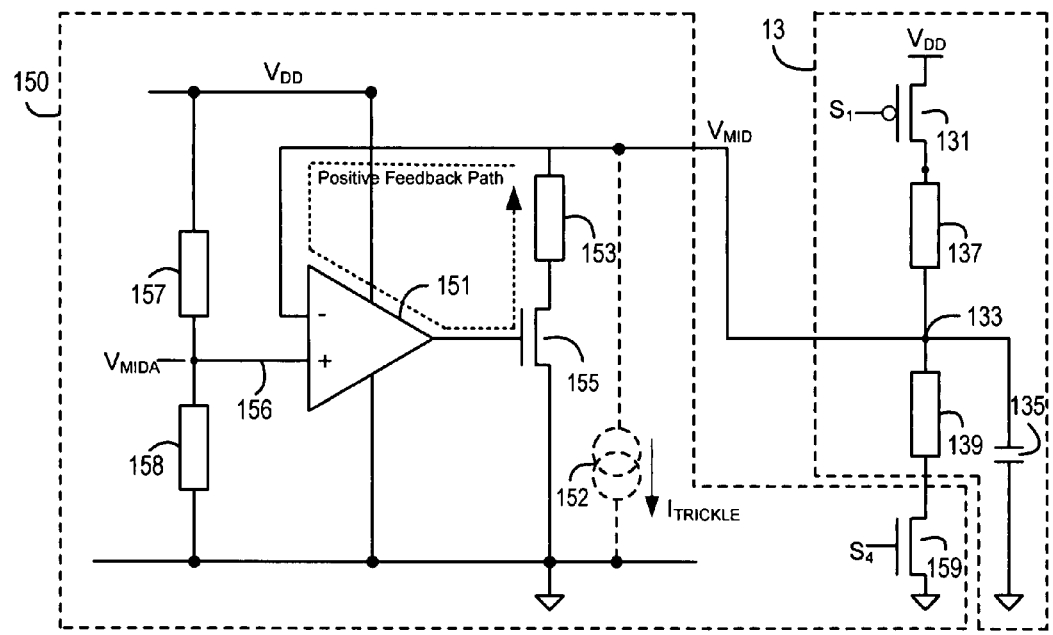
FIG. 5 shows a reference voltage generator circuit having an amplifier power-down apparatus according to a first embodiment of the present invention.

FIG. 5 shows an amplifier power-down apparatus for reducing unwanted signals in an audio circuit according to an embodiment of the present invention. In a similar manner to FIG. 3, a reference voltage generator circuit 13 for producing a reference voltage $V_{MID}$ comprises a potential divider circuit comprising resistive elements 137 and 139. The resistive elements 137 and 139 can be chosen, for example, to provide a reference voltage that is mid-way between the supply rails of VDD and ground. A decoupling capacitor 135 is connected across resistive element 139. The decoupling capacitor 135 may be provided off-chip, if desired, and is used to decouple the $V_{MID}$ node 133. A switch 131, for example a PMOS transistor, is provided for enabling and disabling the reference voltage generator circuit 13.

However, as will be described below, rather than merely using the switch 131 to disable or power-down the reference voltage generator circuit 13, an amplifier power-down apparatus comprising a discharge control circuit 150 is provided for discharging the reference voltage $V_{MID}$ in a controlled manner.

Assuming that the decoupling capacitor 135 is fully charged prior to time $t_{OFF}$, the voltage at node 133 will be $V_{MID}$. The discharge control circuit 150 controls the discharge of the reference voltage $V_{MID}$ as will be described below.

The discharge control circuit 150 comprises an amplifier 151, for example a differential amplifier, configured in a positive feedback arrangement. The differential amplifier 151 is connected to receive the reference voltage $V_{MID}$ on its negative input terminal, and an "artificial" reference voltage $V_{MIDA}$ on its positive terminal. The artificial reference voltage $V_{MIDA}$ is generated using a potential divider circuit comprising resistors 157 and 158. It is noted that other methods of generating the artificial reference voltage $V_{MIDA}$ are also possible.

The output of the differential amplifier 151 drives a pull-down device 155. According to the preferred embodiment the pull-down device is an NMOS transistor, although it will be appreciated that other devices could also be used. The source of the NMOS transistor 155 is connected to ground, while the drain of NMOS transistor 155 is connected to the reference voltage $V_{MID}$ via resistor 153. A switch 159, in the form of an NMOS transistor, is connected between the resistor 139 and ground.

The reference voltage $V_{MID}$ is discharged using the discharge control circuit 150 as follows. First, the switches 131 and 159 are opened, such that the capacitor 135 is left to "float". Preferably the switches 131 and 159 are opened simultaneously, or the switch 159 opened slightly before the switch 131. The provision of switch 159 has the effect of eliminating any effect resistor 139 would otherwise have during the discharge operation.

The differential amplifier 151 compares the reference voltage $V_{MID}$ with the artificial reference voltage $V_{MIDA}$. The artificial reference voltage $V_{MIDA}$ may be arranged to have the same voltage level as $V_{MID}$, i.e. by selecting resistor devices 157 and 158 such that they provide the same reference voltage as that provided by resistor devices 137 and 139 of the reference voltage generator circuit 13. However, it is noted that the voltage level of the artificial reference voltage $V_{MIDA}$ is preferably skewed with respect to the reference voltage $V_{MID}$, i.e. the artificial reference voltage $V_{MIDA}$ is made slightly higher than the reference voltage $V_{MID}$, thereby changing the initial rate of decay of the circuit and to allow for circuit offsets.

A mismatch between $V_{MID}$ and $V_{MIDA}$ means that the discharge circuit 150 is configured such that, given an initial condition where the voltage level of the reference voltage $V_{MID}$ is roughly mid-voltage (i.e. VDD/2), the amplifier controls the gate of transistor 155 such that a small nominal current flows through transistor 155. It will be appreciated that the mismatch between $V_{MID}$ and $V_{MIDA}$ should therefore be as small as possible, in order to minimise the nominal current flow through transistor 155 during the initial stages of power-down. Also, a small mismatch ensures that minimal current is drawn by the discharge control circuit 150 prior to the discharge control circuit being used to power down the reference voltage $V_{MID}$.

As the transistor 155 draws current the reference voltage $V_{MID}$ will fall. Consequently, as the voltage difference between $V_{MID}$ and $V_{MIDA}$ increases (i.e. as $V_{MID}$ falls), the voltage on the gate of transistor 155 also increases due to the positive feedback path. This increase in the voltage on the gate of transistor 155 in turn causes the current through transistor 155 to increase, which in turn increases the rate at which $V_{MID}$ falls.

There are two periods or phases of operation in the discharge control circuit 150 described above. During a first period of operation, the amplifier 151, transistor 155 and resistor 153 operate as a positive feedback path to control the discharge of current from the capacitor 135. However, as the reference voltage $V_{MID}$ falls, a point is reached whereby the transistor 155 is turned hard-on. Once the transistor 155 becomes turned hard-on, the discharge control circuit operates in a second mode of operation, whereby the discharge of current from the capacitor 135 is based on the RC time constant of resistor 153 in parallel with capacitor 135.

The value of resistor 153 sets the maximum rate of change possible, thus contributing and controlling the shape of the $V_{MID}$ decay curve.

It can be seen from the above that the preferred embodiment creates an artificial reference voltage $V_{MIDA}$, and compares this artificial reference voltage with the true reference voltage $V_{MID}$. The positive feedback path created within the discharge circuit 150 is controlled by this voltage difference.

Figure 6:
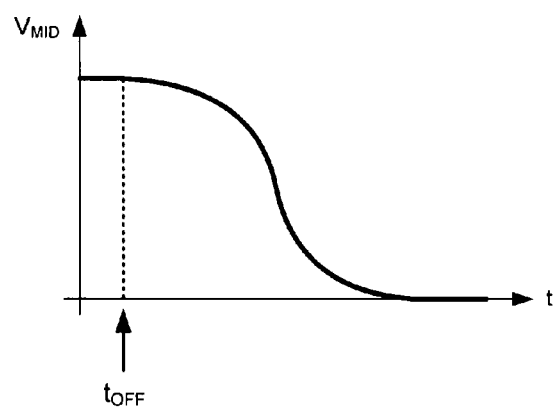
FIG. 6 shows how a reference voltage is discharged using the apparatus of FIG. 5.

In this way the slope of the reference voltage $V_{MID}$ is made to decay in a much more continuous manner and in the form of an S-type waveform shape as illustrated in FIG. 6. In other words, the sudden slope discontinuity at $t_{OFF}$ is minimised or avoided and, instead, the reference voltage $V_{MID}$ discharges in a smoother and more controlled manner during the first discharge phase, thereby reducing or suppressing the high frequency components associated with the prior art waveform which causes "click" or "pop" effects on the output of the amplifier.

After the initial gradual and smooth fall in the slope of the reference voltage $V_{MID}$, the voltage level of $V_{MID}$ then falls more rapidly during the second discharge phase, i.e. after the transistor 155 has become fully turned on, followed by another gradual and smooth transition to its final value as the capacitor 135 completes its discharging process.

Thus, once the voltage $V_{MID}$ has fallen significantly, i.e. beyond the point where the transition would have caused a sudden "pop" due to the slope discontinuity, the transistor 155 becomes turned hard on and acts to discharge the voltage $V_{MID}$ more rapidly, thereby enabling the capacitor 135 to become fully discharged at a rate determined by the RC time constant of resistor 153 and capacitor 135.

In the embodiment above, $V_{MIDA}$ was described as being offset by a nominal amount from $V_{MID}$ in order to assist the operation of the discharge control circuit during start-up. As an alternative to the above described embodiment, it is noted that a current source 152 may be provided between the voltage reference $V_{MID}$ and ground, for drawing a small current $I_{TRICKLE}$ from the capacitor 135 during the initial stages of the discharge process. It will be appreciated that, if such a current source is provided, the artificial reference voltage $V_{MIDA}$ may be configured to be the same as the reference voltage $V_{MID}$, rather than being offset by a nominal amount. However, it will also be appreciated that the discharge control circuit can be configured to have a nominal offset between the artificial reference voltage $V_{MIDA}$ and the reference voltage $V_{MID}$, plus a current source 152.

Figure 7:
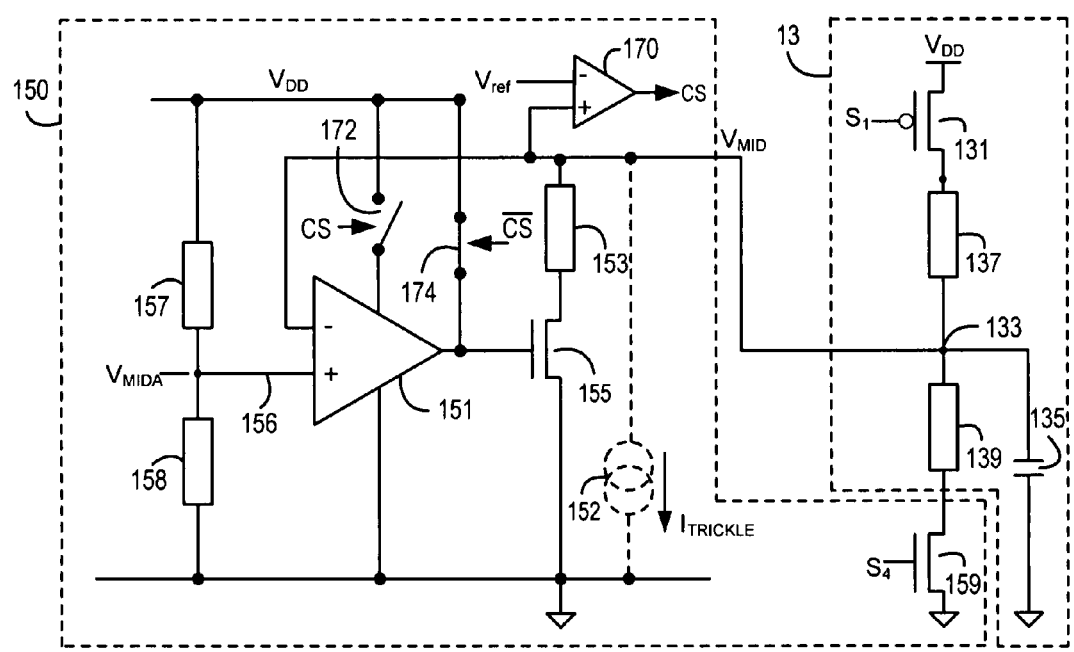
FIG. 7 shows a reference voltage generator circuit having an amplifier power-down apparatus according to a second embodiment of the present invention.

FIG. 7 shows an alternative embodiment of the invention which is adapted to reduce power consumption, particularly when an audio apparatus is being placed in a hibernation mode rather than being powered down completely. If an audio apparatus is being powered down completely, then power consumption of the discharge control circuit 150 is not necessarily an issue, since the discharge control circuit 150 will become powered down itself in due course. However, if an audio apparatus is being placed in a hibernation mode, for example when the audio amplifier is being temporarily powered down, then the embodiment of FIG. 7 provides additional circuitry for reducing power consumption during such periods.

The majority of the components in FIG. 7 are similar to those previously described in relation to FIG. 5. However, the discharge control circuit also comprises switching means in the form of a comparator 170 connected to receive the reference voltage $V_{MID}$ on its positive terminal, and a threshold voltage $V_{ref}$ on its negative terminal. The output signal CS of the comparator 170 is used for controlling a first switch 172, which is connected in the supply rail of the amplifier 151. The compliment of the output signal CS, i.e. $\overline{CS}$, is connected to a second switch 174, which is provided for connecting the gate of transistor 155 to the supply voltage VDD.

Preferably, the threshold voltage $V_{ref}$ is chosen such that it corresponds to a voltage level that is lower than the voltage of $V_{MID}$ when the transistor 155 if fully turned on, but above zero volts. For example, the threshold voltage $V_{ref}$ may be set at $V_{MID}/2$, i.e. VDD/4. In this manner, as the reference voltage $V_{MID}$ is discharged (and after transistor 155 becomes fully turned on), the output of the comparator CS will go low when $V_{MID}$ reaches the threshold voltage $V_{ref}$. This causes switch 172 to open, thereby disconnecting the supply voltage form the amplifier 151 as shown in FIG. 7. In addition, as CS goes low, the complementary signal $\overline{CS}$ goes high, thereby causing switch 174 to close, such that the gate of transistor 155 is connected to the supply voltage VDD, again as shown in FIG. 7. The switch 174 therefore acts as a bypass circuit for controlling the transistor 155 when the amplifier 151 is disabled during the second period of operation. It will be appreciated that other configurations are possible, for example the inputs of the comparator 170 being reversed, and the signals CS and $\overline{CS}$ being interchanged for controlling the switches 172 and 174. Alternative methods of generating the signals CS and $\overline{CS}$ can also be employed.

In the embodiment of FIG. 7 power consumption is therefore reduced by disconnecting the amplifier 151 and its associated circuitry during the second period of operation of the discharge control circuit 150, and instead using the comparator 170 and switches 172, 174 to continue the discharging process. The comparator 170 and switches 172, 174 can also be used after the discharging process has been completed to maintain the reference voltage $V_{MID}$ being tied to ground, for example while the audio circuit is placed in a hibernation mode, without requiring the amplifier 151 and its associated circuitry to be powered.

The embodiments described above have the advantage of reducing and preferably preventing unwanted audio-band signals caused by the slope discontinuity of $V_{MID}$ from causing undesired "pop" sounds during power-down of the reference voltage generator circuit, while still allowing the reference voltage generator circuit to discharge in a timely manner.

It will be appreciated that the amplifier power-down apparatus can be used with other types of reference voltage generator circuits known to those skilled in the art for generating the reference voltage, other than the potential divider circuit shown in the preferred embodiment.

Figure 8:
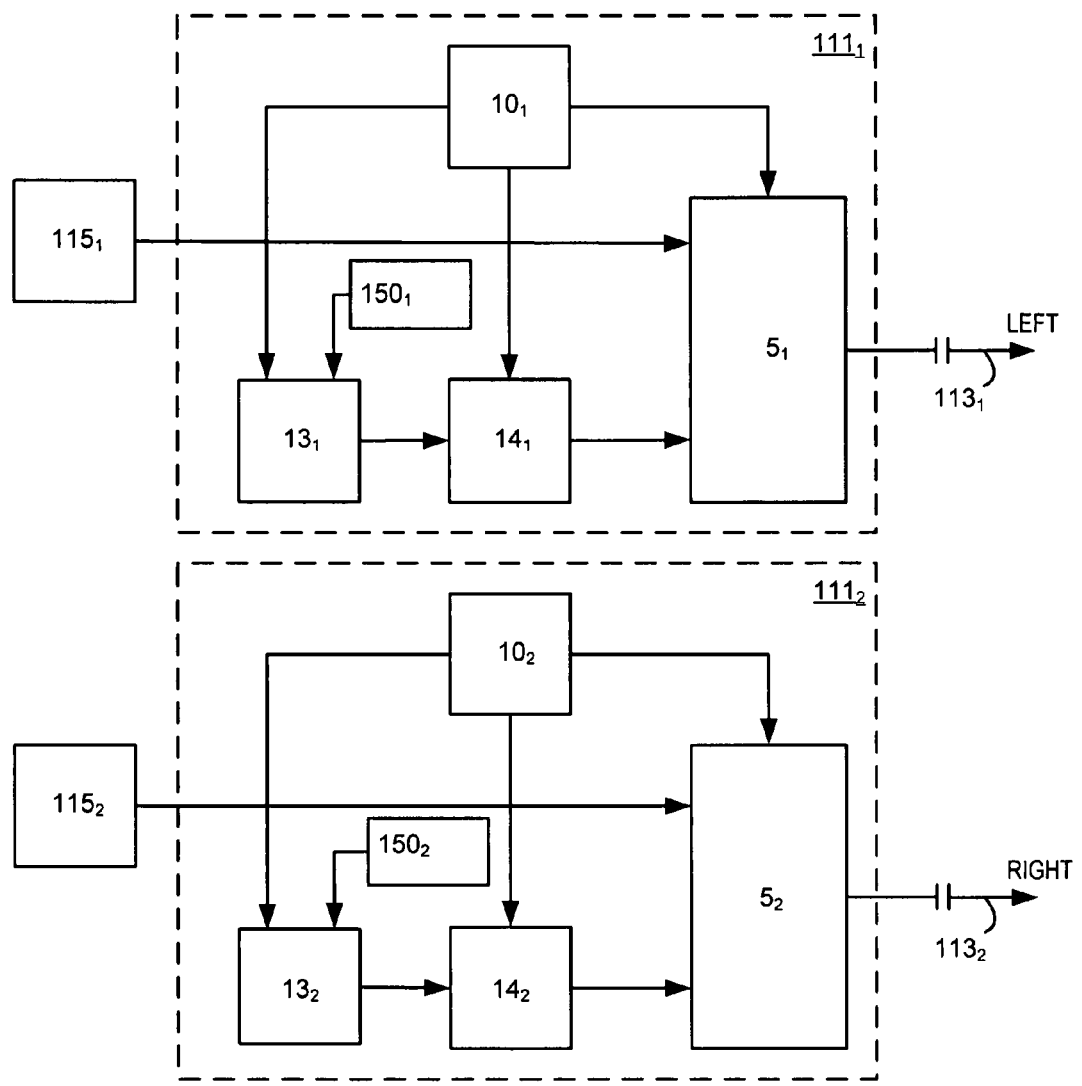
FIG. 8 shows an example of a typical application of the present invention.

While the preferred embodiment has been described in relation to an amplifier circuit that produces one audio output signal, the invention is equally applicable with audio circuits that produce multiple audio output signals, for example a stereo system as shown in FIG. 8. In FIG. 8 the audio system comprises a first audio amplifier circuit $111_1$ for producing a first audio output signal $113_1$ (e.g. left output) from a first source $115_1$, and a second audio amplifier circuit $111_2$ for producing a second audio output signal $113_2$ (e.g. right output) from a second source $115_2$. FIG. 8 is shown as having separate controls $10_1$ and $10_2$ for audio amplifiers $5_1$ and $5_2$. However, it is noted that audio amplifiers $5_1$ and $5_2$ could operate from a single common control 10. Also, while FIG. 8 shows separate $V_{MID}$ reference voltage generators $13_1$ and $13_2$, audio amplifiers $5_1$ and $5_2$ could operate from a single common reference voltage generator 13. It will be appreciated that a single or two amplifier power-down circuits according to the present invention will be employed depending upon whether the system of FIG. 8 comprises one or two $V_{MID}$ reference voltage generators $13_1$ and $13_2$.

Figure 9:
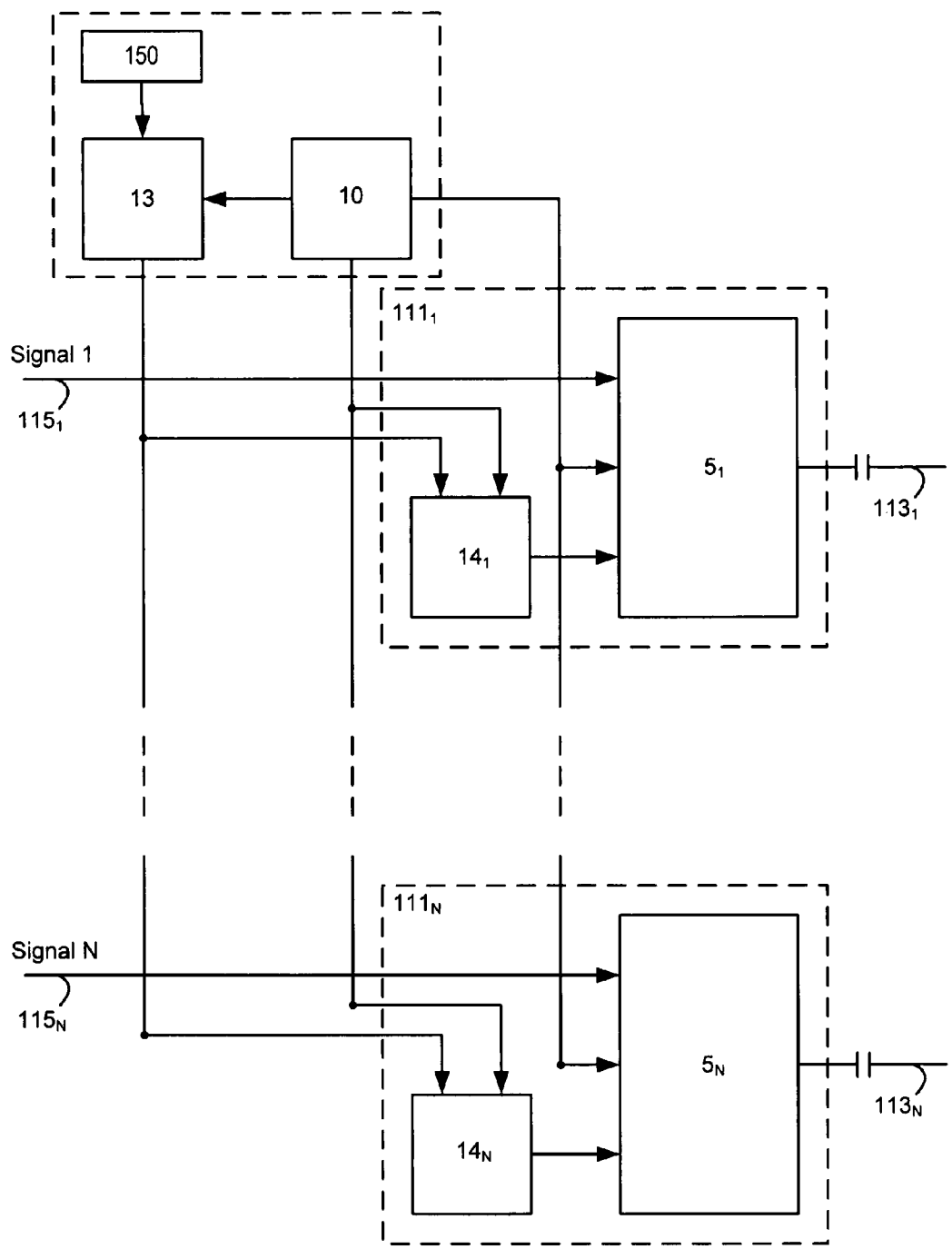
FIG. 9 shows a further example of a typical application of the present invention.

In addition, the invention can be used with an audio system as shown in FIG. 9, relating to a system having a plurality of outputs as used in home cinema applications (for example Dolby™ pro logic 5.1). A single $V_{MID}$ reference voltage generator 13 and a single control logic 10 has been shown as controlling multiple audio amplifiers $5_1$ to $5_N$, each providing a separate output signal $113_1$ to $113_N$ based on input signals $115_1$ to $115_N$. It is noted that the separate buffers $14_1$ to $14_N$ in FIG. 9 could also be replaced by a single buffer 14.

Figure 10:
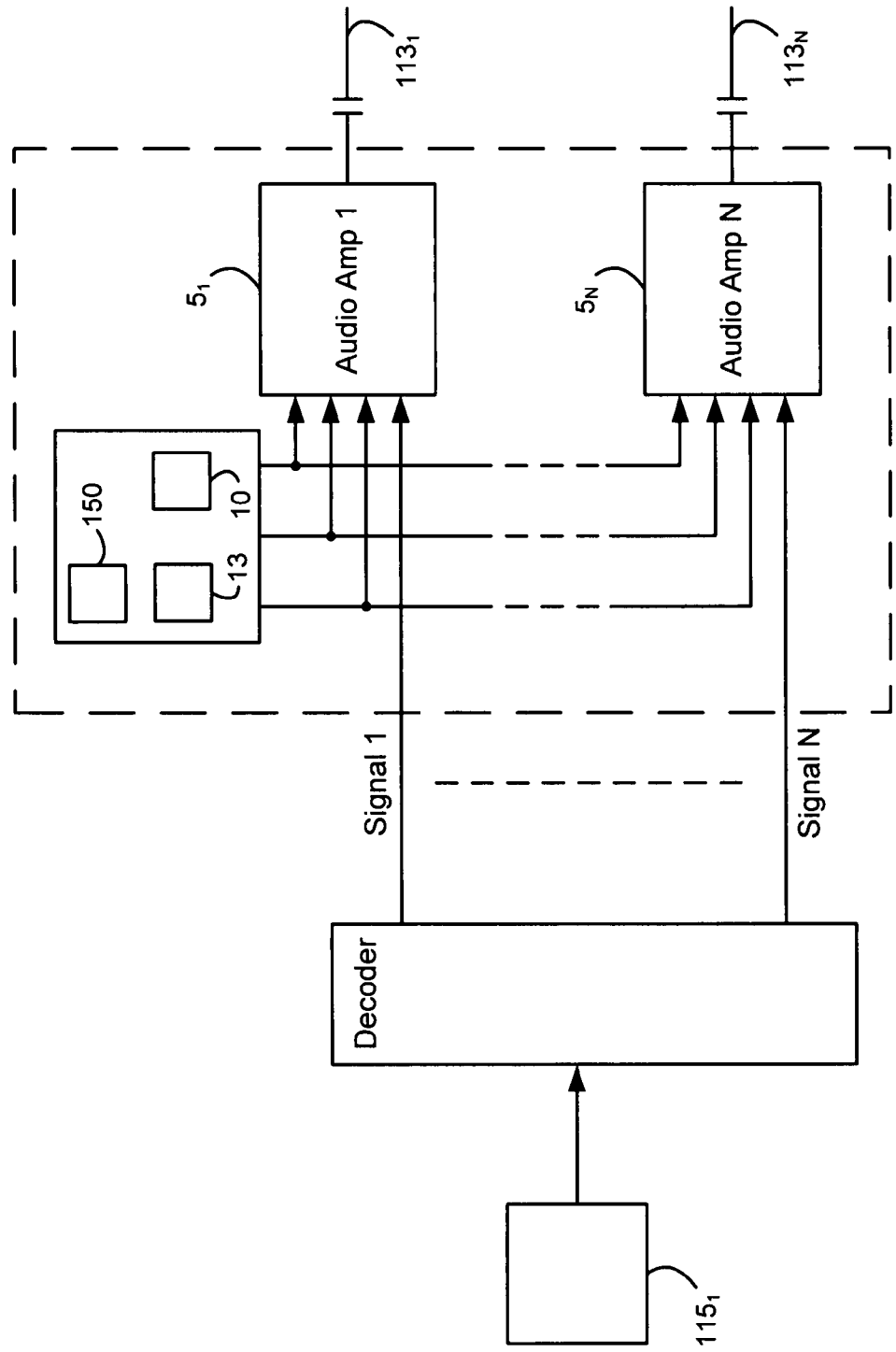
FIG. 10 shows a further example of a typical application of the present invention.
Figure 11:
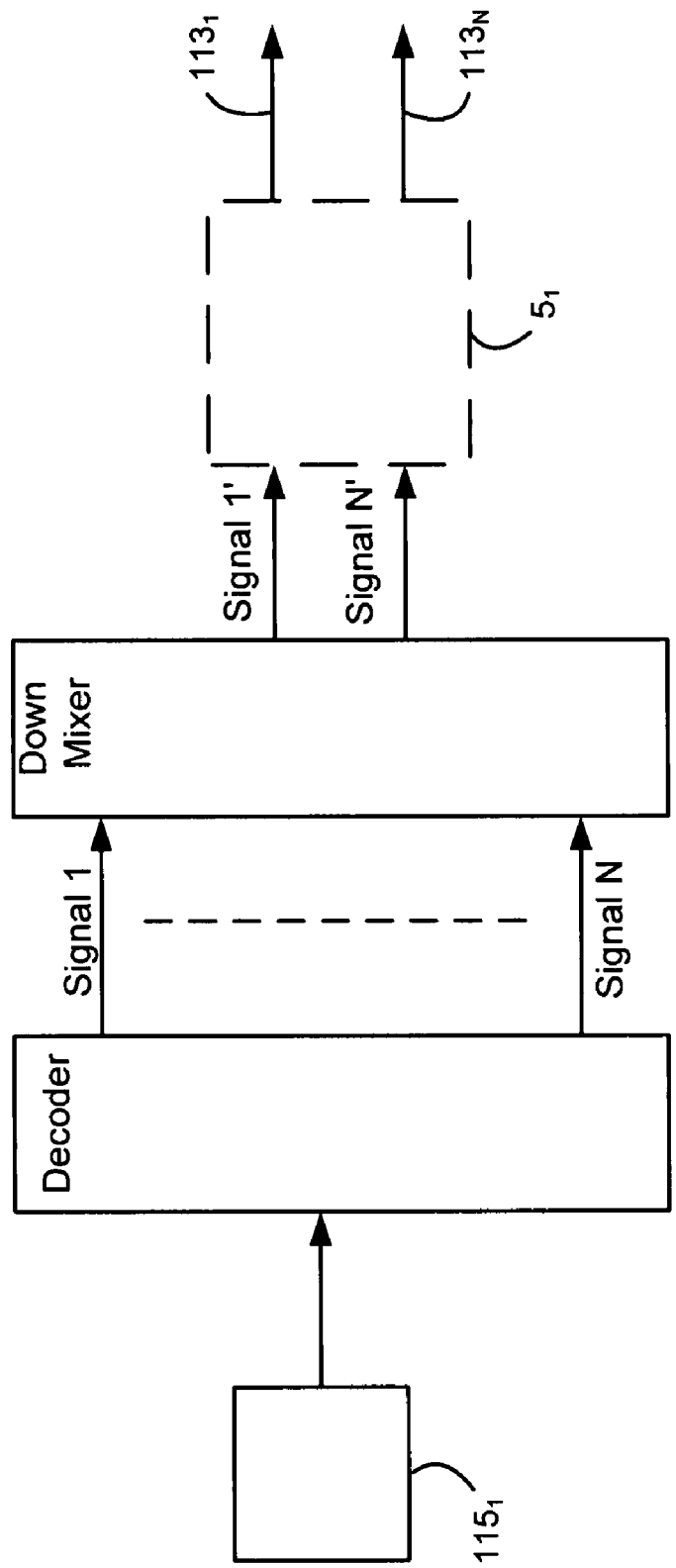
FIG. 11 shows a further example of a typical application of the present invention.

FIGS. 10 and 11 show further typical applications in which the invention can be used. FIG. 10 shows a system in which N input signals are shown as being derived from a Decoder, such as a Dolby™ Decoder, that is used to decode time multiplexed audio signals from a DVD, for example. FIG. 11 shows a system in which N signals from a decoder are fed into a Down Mixer such that signals 1 to N are mixed to form signals 1' to N' (where N'<N). For example, signals 1 to N may be the six signals associated with a home cinema system and signals 1' to N' may be left and right stereo signals which are used to produce stereo output signals 1' and N'.

It will be appreciated by a person skilled in the art that the references to PMOS and NMOS transistors in the description of the preferred embodiments could be implemented by other switching devices, including bipolar devices, and in other configurations providing the same end result.

The amplifier power-down apparatus according to the invention can be used in audio apparatus including, for example, portable audio apparatus, headphone amplifiers, headphones, communications apparatus (eg mobile phones), in-car audio apparatus, and numerous other applications.

It should be noted that the above-mentioned embodiments illustrate rather than limit the invention, and that those skilled in the art will be able to design many alternative embodiments without departing from the scope of the appended claims or drawings. The word "comprising" does not exclude the presence of elements or steps other than those listed in a claim, "a" or "an" does not exclude a plurality, and a single element or other unit may fulfil the functions of several units recited in the claims. Any reference signs in the claims shall not be construed so as to limit their scope.

What is claimed is:

1. An amplifier power-down apparatus for reducing transient signals in an audio circuit comprising a reference voltage generator circuit for generating a reference voltage, the reference voltage generator circuit comprising a capacitor for maintaining the reference voltage at a desired voltage level, the apparatus comprising:
a discharge control circuit for controlling the operation of the reference voltage generator circuit during power-down;
the discharge control circuit comprising an amplifier with a positive feedback path for controlling a current flow from the capacitor;
wherein the discharge control circuit is configured and controlled to operate in a first mode of operation during a first period, and a second mode of operation during a second period, and wherein the discharge control circuit comprises switching means for switching from the first mode of operation to the second mode of operation after discharging for a period of time.

2. An apparatus as claimed in claim 1, wherein the discharge control circuit comprises a transistor device connected between the reference voltage and ground, and wherein the amplifier with the positive feedback path is configured to control the rate of flow of current through the transistor device.

3. An apparatus as claimed in claim 2, wherein the amplifier with the positive feedback path comprises a differential amplifier, the differential amplifier connected to receive the reference voltage being controlled on a first input, and a second reference voltage on a second input.

4. An apparatus as claimed in claim 2, further comprising a resistor device connected in series with the transistor device.

5. An apparatus as claimed in claim 1, wherein the flow of current from the capacitor during the first mode of operation is determined by the transistor device and the positive feedback path.

6. An apparatus as claimed in claim 1, wherein the flow of current from the capacitor during the second mode of operation is determined by the resistor device.

7. An apparatus as claimed in claim 1, wherein the discharge control circuit is configured to disable the amplifier with the positive feedback path when operating in the second mode of operation during the second period.

8. An apparatus as claimed in claim 7, wherein the discharge control circuit comprises a bypass circuit for controlling the transistor device when the amplifier with the positive feedback path is disabled during the second period.

9. An apparatus as claimed in claim 1, wherein the switching means is adapted to switch from the first mode of operation to the second mode of operation when the reference voltage has fallen to a predetermined threshold voltage.

10. An apparatus as claimed in claim 1, wherein the switching means comprises a comparator device, the comparator device connected to receive the reference voltage being controlled on a first input and the threshold voltage on a second input.

11. An apparatus as claimed in claim 3, wherein the voltage level of the second reference voltage, prior to power-down, is configured to be substantially the same as the voltage level of the reference voltage being controlled.

12. An apparatus as claimed in claim 3, wherein the voltage level of the second reference voltage, prior to power-down, is configured to be offset compared to the voltage level of the reference voltage being controlled.

13. An apparatus as claimed in claim 11, further comprising a current source for providing an initial trickle charge to the discharge control circuit during an initial stage of a discharge operation.

14. An apparatus as claimed in claim 1, wherein the reference voltage generator circuit comprises a potential divider circuit for producing the reference voltage, the potential divider circuit comprising first and second resistor devices connected between a power supply and a ground connection, and the capacitor connected between ground and a common node connecting the first and second resistors.

15. An apparatus as claimed in claim 14, further comprising a first switching device connected between the first resistor device of the potential divider circuit and the supply voltage, and a second switching device connected between the second resistor device of the potential divider circuit and ground, the first and second switching devices being operable to isolate the potential divider circuit during power-down.

16. A method for reducing transient signals in an audio circuit comprising a reference voltage generator circuit for generating a reference voltage, the reference voltage generator circuit comprising a capacitor for maintaining the reference voltage at a desired voltage level, the method comprising the steps of:

providing a discharge control circuit for controlling the operation of the reference voltage generator circuit during power-down;

controlling a current flow from the capacitor of the reference voltage generator circuit using an amplifier with a positive feedback path;

configuring the discharge control circuit to operate in a first mode of operation during a first period, and a second mode of operation during a second period; and providing switching means for switching from the first mode of operation to the second mode of operation after discharging for a period of time.

17. A method as claimed in claim 16, further comprising the step of providing a transistor device between the reference voltage and ground, and configuring the amplifier with the positive feedback path to control the rate of flow of current through the transistor device.

18. A method as claimed in claim 16, wherein the amplifier with the positive feedback path comprises a differential amplifier, the differential amplifier connected to receive the reference voltage being controlled on a first input, and a second reference voltage on a second input.

19. A method as claimed in claim 17, further comprising the step of connecting a resistor device in series with the transistor device.

20. A method as claimed in claim 16, wherein the flow of current from the capacitor during the first mode of operation is determined by the transistor device and the positive feedback path.

21. A method as claimed in claim 16, wherein the flow of current from the capacitor during the second mode of operation is determined by the resistor device.

22. A method as claimed in claim 16 further comprising the step of disabling the amplifier with the positive feedback path when operating in the second mode of operation during the second period.

23. A method as claimed in claim 22, further comprising the step of providing a bypass circuit for controlling the transistor device when the amplifier with the positive feedback path is disabled during the second period.

24. A method as claimed in claim 16, wherein the switching step comprises switching from the first mode of operation to the second mode of operation when the reference voltage has fallen to a predetermined threshold voltage.

25. A method as claimed in claim 16, wherein the switching means comprises a comparator device, the comparator device connected to receive the reference voltage being controlled on a first input and the threshold voltage on a second input.

26. A method as claimed in claim 18, further comprising the step of configuring the voltage level of the second reference voltage, prior to power-down, to be substantially the same as the voltage level of the reference voltage being controlled.

27. A method as claimed in claim 18, further comprising the step of configuring the voltage level of the second reference voltage, prior to power-down, to be offset compared to the voltage level of the reference voltage being controlled.

28. A method as claimed in claim 26, further comprising the step of providing an initial trickle charge to the discharge control circuit during an initial stage of a discharge operation.

29. A method as claimed in claim 16, wherein the reference voltage generator circuit comprises a potential divider circuit for producing the reference voltage, the potential divider circuit comprising first and second resistor devices connected between a power supply and a ground connection, and the capacitor connected between ground and a common node connecting the first and second resistors.

30. A method as claimed in claim 29, further comprising the step of providing a first switching device between the first resistor device of the potential divider circuit and the supply voltage, and a second switching device between the second resistor device of the potential divider circuit and ground, and operating the first and second switching devices to isolate the potential divider circuit during power-down.

31. An audio apparatus incorporating an amplifier power-down apparatus according to claim 1.

32. A portable audio apparatus incorporating an amplifier power-down apparatus according to claim 1.

33. A headphone amplifier incorporating an amplifier power-down apparatus or part thereof according to claim 1.

34. A headphone incorporating an amplifier power-down apparatus according to claim 1.

35. A communications apparatus incorporating an amplifier power-down apparatus according to claim 1.

36. An in-car audio apparatus incorporating an amplifier power-down apparatus according to claim 1.

37. A reference voltage signal for use in an audio circuit, the reference voltage signal configured to have an "S" type shape using the amplifier power-down apparatus according to claim 1.

* * * * *